United States Patent [19]

Shirota

[11] Patent Number: 4,697,248

[45] Date of Patent: Sep. 29, 1987

[54] ARITHMETIC CIRCUIT FOR OBTAINING THE VECTOR PRODUCT OF TWO VECTORS

[75] Inventor: Norihisa Shirota, Kanagawa, Japan

[73] Assignee: Sony Corporation, Tokyo, Japan

[21] Appl. No.: 685,125

[22] Filed: Dec. 21, 1984

[30] Foreign Application Priority Data

Dec. 30, 1983 [JP] Japan .................. 58-248204

[51] Int. Cl.[4] ............................................. G06F 7/52
[52] U.S. Cl. .................................................. 364/754
[58] Field of Search ....................................... 364/754

[56] References Cited

U.S. PATENT DOCUMENTS

| | | | |
|---|---|---|---|
| 4,037,093 | 7/1977 | Gregg et al. | 364/754 |
| 4,251,875 | 2/1981 | Marver | 364/754 |
| 4,473,887 | 9/1984 | Odaka | 364/754 |
| 4,587,627 | 5/1986 | Omura et al. | 364/754 |

OTHER PUBLICATIONS

Laws, Jr. et al., "A Cellular-Array Multiplier for GF(2m)" *IEEE Trans. on Computers*, Dec. 1971, pp. 1573-1578.

*Primary Examiner*—David H. Malzahn
*Attorney, Agent, or Firm*—Lewis H. Eslinger; Alvin Sinderbrand

[57] ABSTRACT

In an arithmetic circuit, a first input of m bits representing the vector expression of a first set of elements of a finite field $GF(2m)$ is converted into the components of a matrix, and each component of the matrix is multiplied by second input of m bits representing the vector expression of a second set of elements of the finite field. A vector product of the first and second inputs is thereby obtained.

5 Claims, 6 Drawing Figures

1                                                                    … 2

ARITHMETIC CIRCUIT FOR OBTAINING THE VECTOR PRODUCT OF TWO VECTORS

BACKGROUND OF THE INVENTION

1. Field of the Invention

This invention relates to an arithmetic circuit applied to an encoder and a decoder of an error correction code.

2. Background of the Invention

When a digital video signal, a digital audio signal and the like are recorded and reproduced, an adjacent code or Reed-Solomon code is practically normally used as an error correction code. Parity data (redundant data) is generated in an encoder of such error correction signal, and a syndrome is generated in a decoder from a received word including the parity data. Error correction is performed using the syndrome. An arithmetic circuit for processing the elements of a finite field is used as the hardware of the parity generating circuit, the syndrome generating circuit and the error correction circuit. The finite field is a field of pm elements derived from an irreducible polynomial of m-th order, and the case where p=2 is important for the error correction code. Consequently, this invention is applied to the finite field where p=2.

In a conventional arithmetic circuit used in an encoder and a decoder, when multiplication of elements of the finite field is executed, for example, in the case of ($\alpha i$, $\alpha j$), $\alpha i$ is stored in a ROM (read-only memory) so as to obtain the exponent i and $\alpha j$ is similarly stored in a ROM so as to obtain the exponent j. An adder produces the exponent (i+j) which is stored in a ROM, whereby conversion to $\alpha i+j$ is achieved. In the finite field GF (2m), addition (also subtraction) can be simply implemented using an exclusive-OR gate, but as clearly seen from above-mentioned example, a number of ROMs and registers are required to execute multiplication or division and thereby the scale of the circuit is inevitably enlarged. Moreover, the conventional arithmetic circuit is constituted by dedicated hardware of each kind of polynomial or operation and therefore cannot be used for general purposes.

SUMMARY OF THE INVENTION

Accordingly, an object of the invention is to provide an improved arithmetic circuit wherein the necessary amount of memories such as ROMs and registers is decreased and the scale of the circuit is reduced.

Another object of the invention is to provide an arithmetic circuit that can execute an operation such as multiplication, division or raising to a power, using arbitrary elements of a finite field.

Still another object of the invention is to provide an arithmetic circuit that is suitable for use as an encoder and a decoder of an error correction code.

According to this invention, a first input of m bits, being a vector expression of the elements of a finite field GF (2m), is converted into components of a matrix expression of the same components. Each component of the matrix is multiplied with a second input of m bits which are a vector expression of the elements of the finite field GF (2m). This multiplication of the first and second inputs is obtained as a vector expression of the finite field GF (2m).

DETAILED DESCRIPTION OF THE PREFERRED EMBODIMENTS

An embodiment of the invention will now be described regarding the finite field GF (2m) for easy understanding.

Figure 1:
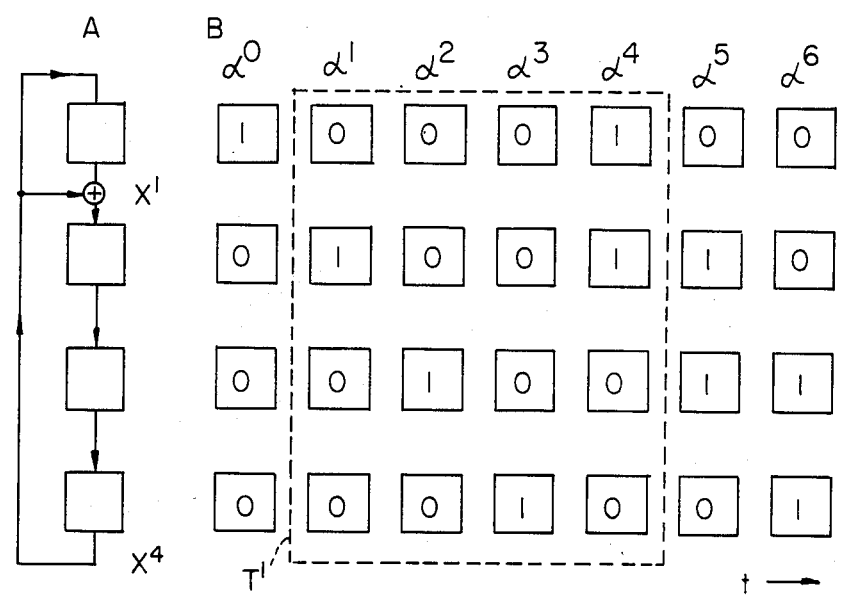
FIG. 1 is a schematic diagram illustrating the relation between the elements of a finite field and the matrix expression thereof.

First, the relation between a generator polynomial g(x) and an element $\alpha i$ of GF (2m) will be described. For example, assume that $g(x)=x^4+x+1$. The coefficients of the generator polynomial g(x) in power descending order are respectively (1, 0, 0, 1, 1). Corresponding to the coefficients, a shift register circuit having a feedback loop can be constituted as shown in FIG. 1(A). In FIG. 1(A), an adder inserted between a register of the first stage and a register of the next stage adds (mod. 2).

If an initial value (1000) is set in the shift register circuit as shown in FIG. 1(B) and then the shift operation is executed in sequence, the content of each register varies as shown in FIG. 1(B). If the root of g(x)=0 is made $\alpha(=\alpha^1)$, $\alpha^4+\alpha+1=0$ hence $\alpha^4=\alpha+1$. Consequently, variation in the content of the registers shown in FIG. 1(B) is expressed as a power of $\alpha$ as follows:

| | |
|---|---|
| $\alpha 0$: (1000) | $\alpha 8$: (1010) |
| $\alpha 1$: (0100) | $\alpha 9$: (0101) |
| $\alpha 2$: (0010) | $\alpha 10$: (1110) |
| $\alpha 3$: (0001) | $\alpha 11$: (0111) |
| $\alpha 4$: (1100) | $\alpha 12$: (1111) |
| $\alpha 5$: (0110) | $\alpha 13$: (1011) |
| $\alpha 6$: (0011) | $\alpha 14$: (1001) |
| $\alpha 7$: (1101) | $\alpha 15$: (1000) |

Elements having a value of $\alpha^4$ or more are expressed as linear combinations of $\alpha^0$, $\alpha^1$, $\alpha^2$, $\alpha^3$ using the equation ($\alpha^4=\alpha+1$). That is, $$\alpha 4 = \alpha + 1$$

$$\alpha 5 = \alpha \cdot \alpha 4 = \alpha(\alpha + 1) = \alpha 2 + \alpha$$

$$\alpha 6 = \alpha 2 \cdot \alpha 4 = \alpha 2(\alpha + 1) = \alpha 3 + \alpha 2$$

$$\alpha 8 = \alpha 4 \cdot \alpha 4 = (\alpha + 1)(\alpha + 1) = \alpha 2 + 1$$

Thus the expression of $\alpha^4$ or more using a vector expression of $\alpha^0-\alpha^3$ is shown in FIG. 1(B).

Next, a relation between $\alpha$ and the matrix T will be described. If $g(x)=x^4+x+1$, the adjoint matrix T becomes $$T = \begin{pmatrix} 0 & 0 & 0 & 1 \\ 1 & 0 & 0 & 1 \\ 0 & 1 & 0 & 0 \\ 0 & 0 & 1 & 0 \end{pmatrix}$$

If $\alpha^i$ is FIG. 1(B) in a column vector, it follows that $$T = [\alpha^1, \alpha^2, \alpha^3, \alpha^4]$$

Then $T^2$ becomes $$T^2 = T \times T = \begin{pmatrix} 0 & 0 & 1 & 0 \\ 0 & 0 & 1 & 1 \\ 1 & 0 & 0 & 1 \\ 0 & 1 & 0 & 0 \end{pmatrix}$$

Expressing $T^2$ using $\alpha^i$, it follows that $T^2 = [\alpha^2, \alpha^3, \alpha^4, \alpha^5]$. That is, $$T^i = [\alpha^i, \alpha^{i+1}, \alpha^{i+2}, \alpha^{i+3}]$$

wherein $i = 0, 1, 2, \ldots, 14$, and $i+1, i+2, i+3$ may be estimated in (mod. 15). In other words, the first row of $T^i$ is coincident with $\alpha^i$, the vector expression of $\alpha$.

Next, the expression $\alpha^i \times \alpha^j = \alpha^{i+j}$ will be described. Although vectors cannot be mutually multiplied, a matrix can be multiplied with a vector. Consequently, if the $\alpha^i$ is converted into the matrix expression $T^i$, the multiplication of $\alpha^i \times \alpha^j$ becomes possible. The multiplication of T with $\alpha$ is $$T \cdot \alpha = \begin{pmatrix} 0 & 0 & 0 & 1 \\ 1 & 0 & 0 & 1 \\ 0 & 1 & 0 & 0 \\ 0 & 0 & 1 & 0 \end{pmatrix} \begin{pmatrix} 0 \\ 1 \\ 0 \\ 0 \end{pmatrix} = \begin{pmatrix} 0 \\ 0 \\ 1 \\ 0 \end{pmatrix} = \alpha^2$$

If $i = 2$ or more, it follows that $$T \times \alpha^i = T \times \alpha \times \alpha^{i-1} = \alpha^2 \times \alpha^{i-1} = \alpha^{i+1}$$

It is understood generally that $T\alpha^i = \alpha^{i+1}$. From this relation, it follows that $$\alpha^4 = T\alpha^3 = T^2\alpha^2 = T^3\alpha^1 = T^4\alpha^0$$

In general, the expression $\alpha^{i+j} = T^i \cdot \alpha^j$ holds. As a result of the above relation, the $\alpha^i$ and the $T^i$ may be deemed identical in multiplication, and therefore in order to calculate the expression $\alpha^i \times \alpha^j$, the expression $T^i \times \alpha^j$ may be calculated.

Since $T^i$ may be expressed as $T^i = [\alpha^i, \alpha^{i+1}, \alpha^{i+2}, \alpha^{i+3}]$ as above described, if another vector can be produced from $\alpha^i$, it follows that all components of the matrix $T^i$ can be known. Consequently, by multiplying these components with $\alpha^j$, the multiplication of $(\alpha^i \times \alpha^j)$ can be executed.

Figure 2:
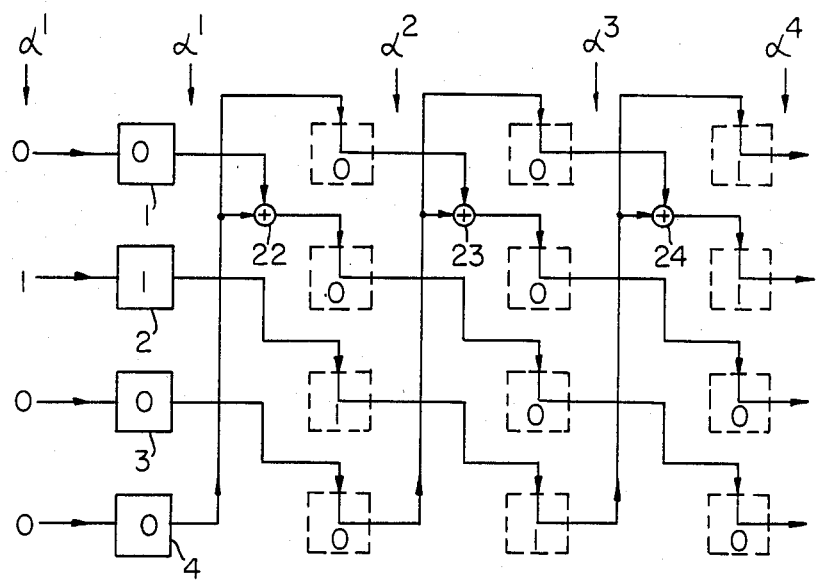
FIG. 2 is a connection diagram of a converter to convert data of a vector expression into components of a matrix expression.

FIG. 2 shows a circuit for converting $\alpha^1$ expressed as a vector into a matrix expression $T^1$ wherein $g(x) = x^4 + x + 1$. Using the shift register circuit having the feedback loop shown in FIG. 1(A), each register $\alpha^i$ is set and the shift operation is executed three times so as to generate $\alpha^{i+1}, \alpha^{i+2}, \alpha^{i+3}$ in sequence. Consequently, four registers 1, 2, 3, 4 in FIG. 2 are supplied with $\alpha^i$, say $\alpha^1$, from outside, and, by means of a connection equivalent to thence shift operations, the components of the matrix $T^1$ can be generated simultaneously at the outputs of the four input registers at positions shown by broken lines in FIG. 2. That is, the output side of the registers 1 through 4 is shifted downwards by one bit, and the most significant bit and the least significant bit are added by adders 22, 23, 24 (mod. 2) at every shifting operation.

Figure 3:
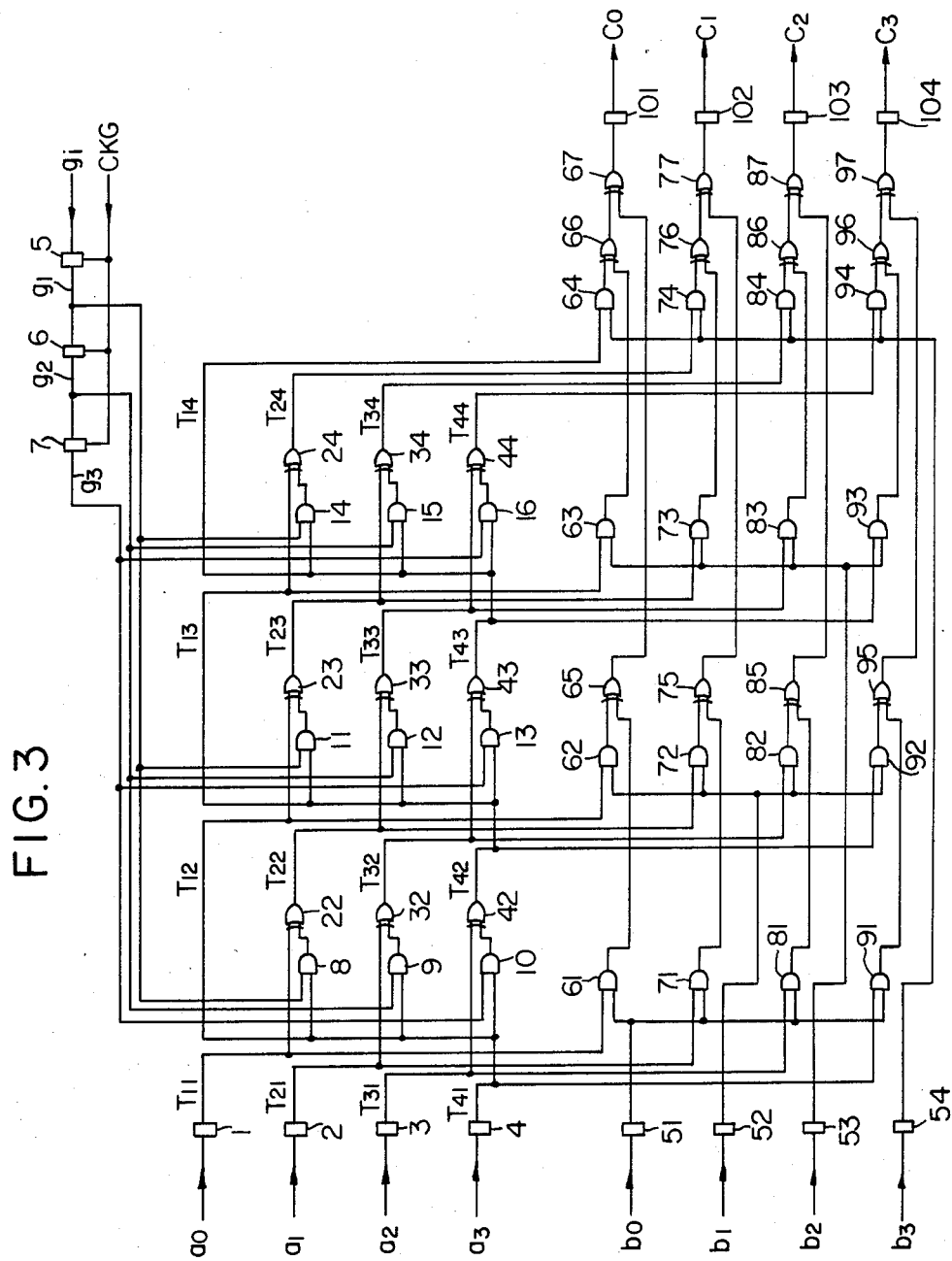
FIG. 3 is a connection diagram of an embodiment of the invention.

FIG. 3 shows a circuit construction showing an embodiment of the invention, wherein the inputs $\alpha^i$ ($a_0$, $a_1$, $a_2$, $a_3$ from the LSB (least significant bit)) are supplied. Coefficients $g_i$ of the generator polynomial $g(x)$ are supplied to cascade connected registers 5, 6, 7, and the coefficients $g_3$, $g_2$, $g_1$ are taken from the registers 5, 6, 7. If $g(x) = x^4 + x + 1$, it follows that $g_1 = 1$, $g_2 = g_3 = 0$. The coefficient $g_1$ is supplied to AND gates 8, 11, 14, the coefficient $g_2$ is supplied to AND gates 9, 12, 15, and the coefficient $g_3$ is supplied to AND gates 10, 13, 16.

Outputs of the AND gates 8, 9, 10 are supplied to exclusive-OR gates (hereinafter referred to as EXOR gates) 22, 32, 42 respectively at respective first inputs of the EXOR gates. Outputs of the AND gates 11, 12, 13 are supplied to EXOR gates 23, 33, 43 respectively at respective first inputs thereof. Outputs of the AND gates 14, 15, 16 are supplied to EXOR gates 24, 34, 44 respectively at respective first inputs thereof. The respective sets of the three AND gates in each line are commonly supplied with the MSB (most significant bit) from the previous line. The respective sets of the three AND gates in each line always become 0 when the coefficient $g_i$ of the generator polynomial is 0, and the former supplies the feedback data to the EXOR gate when the coefficient $g_i$ is 1. For example, when $g_1 = 1$ and $g_2 = g_3 = 0$, the EXOR gates 22, 23, 24 act as an adder mod. 2 and other EXOR gates only make the state of the preceding AND gates pass as it is.

Consequently, the MSB in the previous line and outputs of the EXOR gates 22, 23, 24, ..., 44 constitute all the components of a matrix corresponding to the inputs $a_0$ through $a_3$. Elements ($b_0$, $b_1$, $b_2$, $b_3$) of another field $GF(2^m)$ multiplied with the inputs converted into a matrix expression are written in registers 51, 52, 53, 54. The multiplication of the elements ($b_0$, $b_1$, $b_2$, $b_3$,) by the matrix components is represented by $$\begin{pmatrix} T_{11} & T_{12} & T_{13} & T_{14} \\ T_{21} & T_{22} & T_{23} & T_{24} \\ T_{31} & T_{32} & T_{33} & T_{34} \\ T_{41} & T_{42} & T_{43} & T_{44} \end{pmatrix} \begin{pmatrix} b_0 \\ b_1 \\ b_2 \\ b_3 \end{pmatrix}$$

and the outputs $c_0$, $c_1$, $c_2$, $c_3$ of the multiplication are as follows:

$$c_0 = T_{11} b_0 + T_{12} b_1 + T_{13} b_2 + T_{14} b_3$$

$$c_1 = T_{21} b_0 + T_{22} b_1 + T_{23} b_2 + T_{24} b_3$$

$$c_2 = T_{31} b_0 + T_{32} b_1 + T_{33} b_2 + T_{34} b_3$$

$$c_3 = T_{41} b_0 + T_{42} b_1 + T_{43} b_2 + T_{44} b_3$$

The multiplication to generate the output $c_0$ is executed by AND gates 61, 62, 63, 64, and the addition is executed by EXOR gates 65, 66, 67. The output of the EXOR gate 67 is stored as $c_0$ in a register 101.

The multiplication to generate the output $c_1$ is executed by AND gates 71, 72, 73, 74, and the addition is executed by EXOR gates 75, 76, 77. The output of the EXOR gate 77 is stored as $c_1$ in a register 102. Similarly, the output $c_2$ formed by AND gates 81, 82, 83, 84 and EXOR gates 85, 86, 87 is stored in a register 103, and the output $c_3$ formed by AND gates 91, 92, 93, 94 and EXOR gates 95, 96, 97 is stored in a register 104.

Thus the circuit shown in FIG. 3 can be used for multiplying the two vectors of the finite field GF(2m) so as to generate a vector product output and change the generator polynomial g(x).

In above-mentioned embodiment of the invention, assume that $(a_0, a_1, a_2, a_3)$ is input A, $(b_0, b_1, b_2, b_3)$ is input B, and $(c_0, c_1, c_2, c_3)$ is output C. Then if $\alpha^N$ is supplied as input A, output C of $\alpha^N \cdot B$ is obtained, wherein N is a value arbitrarily determined among (0, 1, 2, ..., 2m−2), and $\alpha^N$ can be formed by supplying N as the address of a ROM. Similarly, $\alpha^N$ can be generated by another ROM so as to form the output C of $\alpha^{-N} \cdot B$, and further $\alpha^{-i}$ can be generated by another ROM so as to form output C of $\alpha^{-i} \cdot B$.

Figure 4:
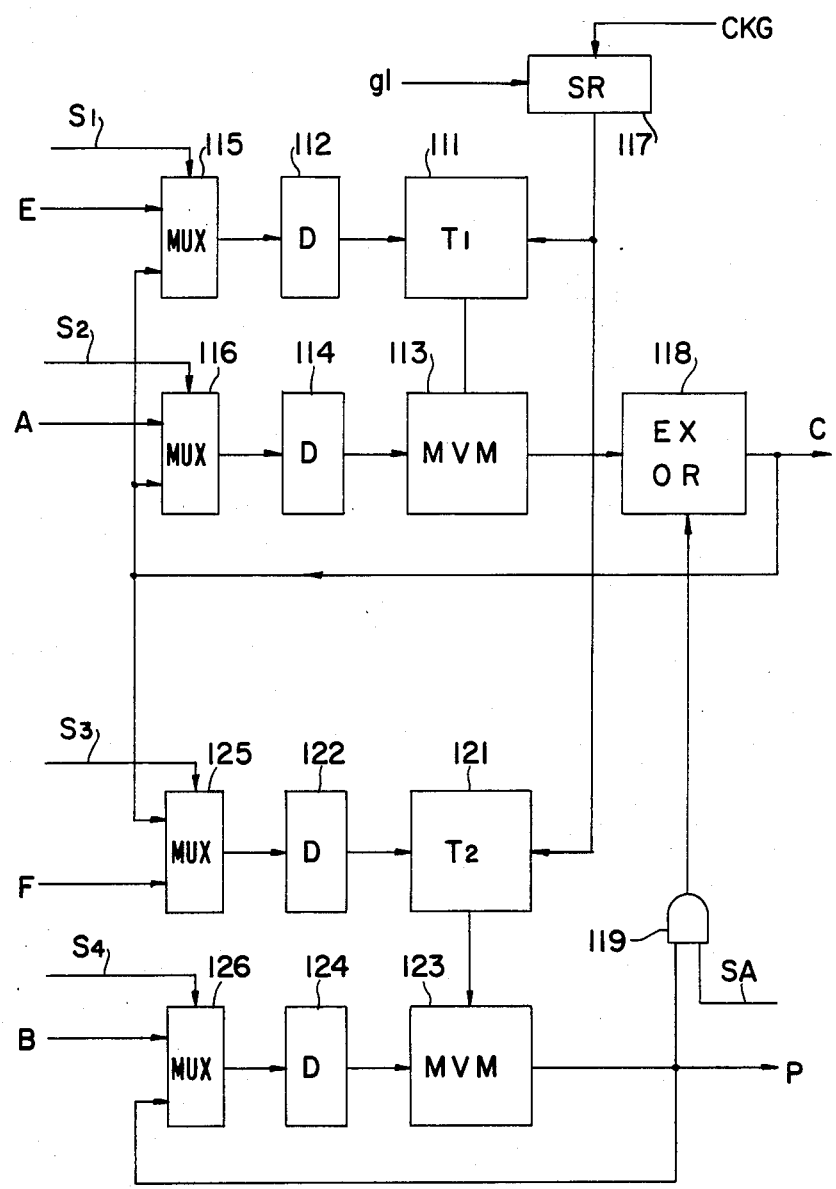
FIG. 4 is a block diagram of another embodiment of the invention.

Another embodiment of the invention, shown in FIG. 4, is an arithmetic circuit where a multiplier shown in FIG. 3 is used, and various operations as are described above can be executed without using a ROM.

In FIG. 4, reference numerals 111 and 121 designate converters to convert input data expressed as vectors into components of matrix T, and numerals 112 and 122 designate registers of m bits to store inputs to the converters 111 and 121. The converters 111 and 121 are supplied with coefficients of the generation polynominal from a shift register 117. The shift register 117 executes a shift operation in response to a clock CKG. Numerals 113 and 123 designate multiplication gates to execute matrix multiplication of components of the matrix T from the converters 111 and 121 with data of m bits representing a vector. The multiplication gates 113 and 123 are supplied with data of m bits from registers 114 and 124.

Input data to the register 112 is selected by a multiplexer 115 which is controlled by select signal $S_1$. Input data to the register 114 is selected by a multiplexer 116 which is controlled by select signal $S_2$. Similarly, the registers 122 and 124 are supplied with data selected by multiplexers 125 and 126, respectively. The multiplexers 125 and 126 are controlled by select signals $S_3$ and $S_4$, respectively. The multiplication output of the multiplication gate 113 is supplied to EXOR gate 118; the multiplication output of the multiplication gate 123 is supplied through AND gate 119 to the EXOR gate 118. The AND gate 119 is supplied with a control signal SA, and, if the control signal SA is 1, the addition output (mod. 2) from outputs of both multiplication gates 113 and 123 is taken as output signal C. If the control signal SA is 0, the output of the multiplication gate 113 becomes output signal C.

The multiplexers 115, 116, 125, 126 are supplied with input data of m bits E, A, F, B respectively at data inputs of the multiplexers. The output data C is fed back as additional input data to the multiplexers 115, 116, 125. Further, the multiplication output of the multiplication gate 123 is fed back as additional input data to the multiplexer 126. The output data of the multiplication gate 123 is taken as output data P.

In the arithmetic circuit shown in FIG. 4, the operation mode set by the select signals $S_1$-$S_4$ and the control signal SA will be described.

First, the operation mode will be described when all select signals $S_1$, $S_2$, $S_3$, $S_4$ are 0 and the control signal SA is 1. Then the input data E, A, F, B are selected by the multiplexers 115, 116, 125, 126 respectively, and the multiplication output of the multiplication gate 123 is supplied through the AND gate 119 to the EXOR gate 118. Consequently, if matrices of the converters 111 and 121 are designated by $T_1$ and $T_2$ respectively, the output data C of $(C = T_1 A + T_2 B)$ is obtained. If the input data E and F are $\alpha^i$ and $\alpha^j$ respectively, it follows that $T_1 = T^i$, $T_2 = T^j$. Consequently, the operation $$C = T^i \cdot A + T^j \cdot B$$

can be executed. This operation is required in order to implement an error correction circuit.

The operation $\beta^N$ will be described as a second example. Since the number of the power is usually given in binary notation, GF($2^4$) where m=4 will be studied. Then the number of the power N is expressed as follows:

$$N = n_0 \cdot 2^0 + n_1 \cdot 2^1 + n_2 \cdot 2^2 + n_3 \cdot 2^3$$

Consequently, the operation $\beta^N$ is executed as follows:

$$\beta^N = \beta^{n_0 + 2n_1 + 4n_2 + 8n_3}$$
$$= \beta^{n_0} \times \beta^{2n_1} \times \beta^{4n_2} \times \beta^{8n_3}$$

wherein $n_0$, $n_1$, $n_2$, $n_3$ are 0 or 1. Consequently, $\beta^2$, $\beta^4$, $\beta^8$ may be formed from a given $\beta$, and the power operation be executed according to the number of the power.

Figure 5:
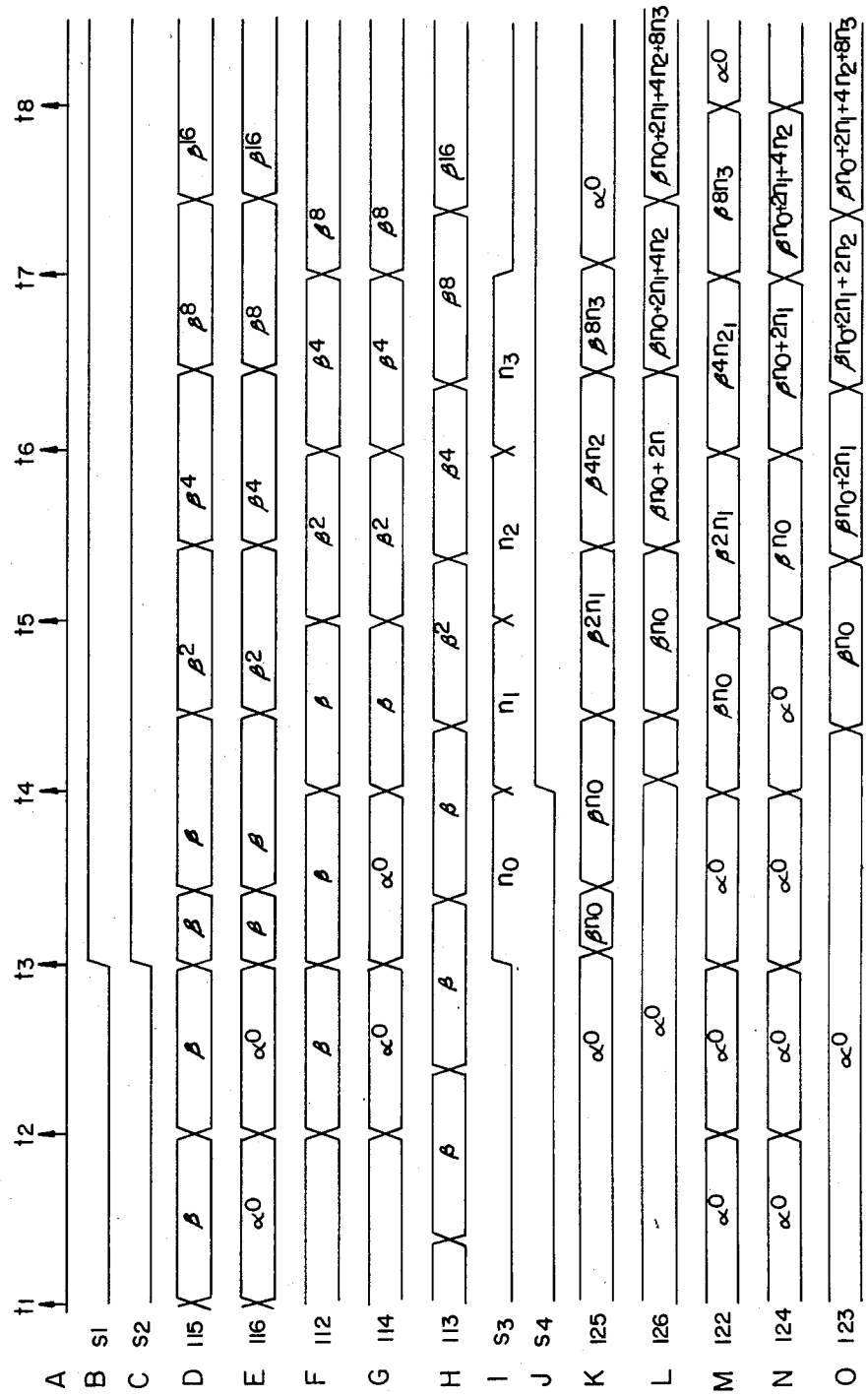
FIG. 5 is a time chart illustrating operation of embodiment in FIG. 4.

The procedure during the arithmetic operation of $\beta^N$ will be described referring to FIG. 5. FIG. 5(A) shows clocks of the arithmetic circuit, and the select signals $S_1$ and $S_2$ are 0 during the time $t_1$, $t_2$ as shown in FIG. 5(B) and FIG. 5(C). Data $\beta$ of four bits is entered as input data E, and $\alpha^0 (=1000)$ is entered as input data A, F, B. The select signals $S_1$ and $S_2$ become 1 at time $t_3$ and calculation is started.

Input data $\beta$ and $\alpha^0$ are outputted from the multiplexer 115 and 116 as shown in FIG. 5(D) and FIG. 5(E), and these data are outputted from the registers 112 and 114 with a delay of one clock as shown in FIG. 5(F) and FIG. 5(G). At time $t_3$, the output of the register 112 becomes $\beta$ and the output of the register 114 becomes $\alpha^0$. Since the control signal SA is 0 and output $\beta$ of the multiplication gate 113 is fed back through the multiplexer 115 and 116 to the registers 112 and 114, the outputs of the registers 112 and 114 become $\beta$ at time $t_4$. The outputs of the registers 112 and 114 become $\beta^2$ at time $t_5$, and then vary to $\beta^4$, $\beta^6$, $\beta^8$. FIG. 5(H) shows the output of the multiplication gate 113.

The output of the multiplication gate 113 is supplied through the EXOR gate 118 to the multiplexer 125. Select signal $S_3$ of the multiplexer 125 is changed at every clock corresponding to binary expression of the exponent N ($n_0$, $n_1$, $n_2$, $n_3$) as shown in FIG. 5(I). If the select signal $S_3$ is 0, the input data F $(=\alpha^0)$ is selected; if the select signal $S_3$ is 1, the output data of the multiplication gate 113 is selected. Consequently, the output of the multiplexer 125 becomes $\beta^{n_0}$, $\beta^{2n_1}$, $\beta^{4n_2}$, $\beta^{8n_3}$ in sequence as shown in FIG. 5(K), and the output of the register 122 becomes the output of the multiplexer 125 with a delay of one clock as shown in FIG. 5(M).

Select signal $S_4$ becomes 1 at time $t_4$ as shown in FIG. 5(J), and the output of the multiplication gate 123 is selected from input data B $(=\alpha^0)$ after time $t_4$. FIG. 5(L) shows the output of the multiplexer 126, and the output of the multiplexer 126 is taken in the register 124 which produces the output shown in FIG. 5(N). At time $t_4$, $\beta^{n_0}$ from the register 122 and $\alpha^0$ from the register 124 are supplied to the multiplication gate 123. The output data P of $(\alpha^0 \times \beta^{n_0} = \beta^{n_0})$ shown in FIG. 5(O) is generated. At time $t_5$, since the input to the multiplication gate 123 becomes $\beta^{2n1}$ and $\beta^0$, the output P of the multiplication gate 123 becomes $\beta^{n0+2n1}$. Similarly, corresponding to the input supplied to the multiplication gate 123 at time $t_6$, $t_7$, the output P of $\beta^{n0+2n1+4n2+8n3}$ is obtained from the multiplication gate 123. Although not shown, the output data P is passed through a register and thereby synchronized with the clock and value $\beta^8$ is outputted at time $t_8$.

The operation mode of $\beta^{-1}$ will be described as a third example. In a finite field of GF($2^4$), since an arbitrary element $\beta$ other than 0 is $$\beta^{15}=1$$

it follows that $$\beta^{-1}=\beta^{14}$$

That is, N may be made (N=14) and if N=(0111) is inputted as a select signal $S_3$, $\beta^{-1}$ is outputted as output data P. In calculating mod. (2m−1), values of N in binary notation may be all converted in order to change N into −N.

In a fourth operation mode of $\beta^{-N}$, binary notation of the number of power N may be only converted. Consequently, if $\beta$ is supplied as input data E and $\alpha^0$ is supplied as input data A, F, B, and the converted number of the power $\overline{N}$ as the select signal $S_3$ is supplied from the LSB in sequence, $\beta^{-N}$ can be obtained as the output data P.

A fifth operation mode ($\beta^N \times \gamma$, $\beta^{-N} \times \gamma$) will be described. This is nearly identical to the second and third operation modes, and $\gamma$ may be entered as input data B in place of $\alpha^0$.

A sixth operation mode ($\alpha^i x$, $\alpha^{-i} x$) will be described. In this case, $\alpha$ may be supplied as input data E, $\alpha^0$ be supplied as input data A, F and $\gamma$ be supplied as input data B, and further binary notation data of exponent i or −i be supplied from the LSB in sequence.

Figure 6:
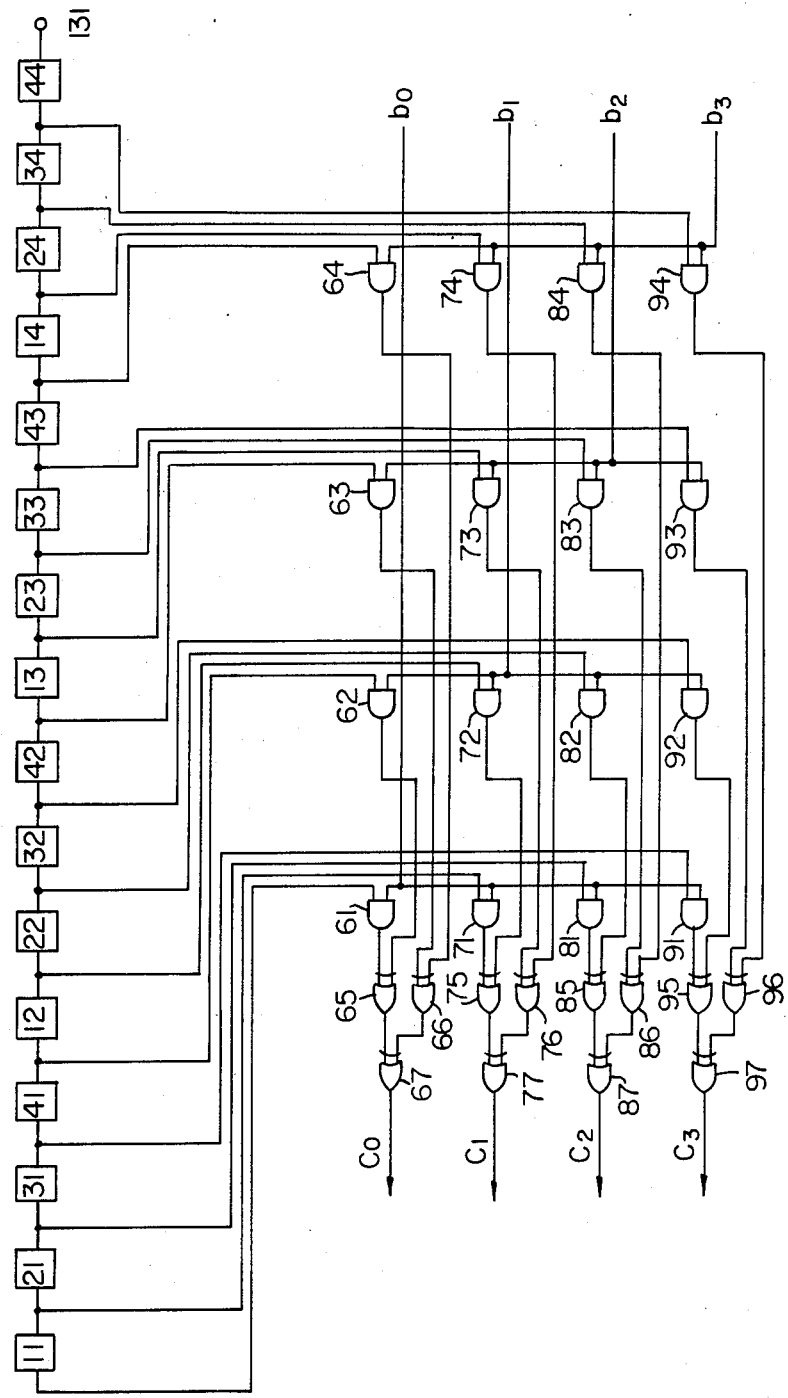
FIG. 6 is a connection diagram of still another embodiment of the invention.

As shown in FIG. 6, in order to mutually multiply elements of a finite field GF($2^4$) representing vectors, all components of one element in the matrix expression (16 bits) may be entered from input terminal 131 in series to the shift register circuit, and components of 16 bits be multiplied by the vector (b0, b1, b2, b3). In FIG. 6, each register of the shift register circuit is designated by a suffix of each component of the matrix, and AND gates and EXOR gates to constitute the multiplication gate are designated by reference numerals identical to those in FIG. 3.

What is claimed is:

1. An arithmetic circuit comprising:
   means for generating as a first input a first set of m bits representing a first vector of a finite field GF(2m) and for generating as a second input a second set of m bits representing a second vector of said finite field;
   means for converting said first set of m bits into components of a matrix corresponding to said first vector; and
   means for multiplying each of said components by said second set of m bits, thereby to obtain as an output a vector product of said first and second inputs.

2. An arithmetic circuit according to claim 1, in which said converting means comprises a shift register which has a plurality of stages and a feedback loop corresponding to coefficients of a generator polynomial.

3. An arithmetic circuit according to claim 2, in which said converting means further comprises a clock pulse generator, from which a clock pulse is supplied to said shift register, so that a value stored in said shift register is sequentially shifted in response to said clock signal, and means for generating a plurality of outputs from each stage of said shift register at every clock signal to obtain said components.

4. An arithmetic circuit according to claim 3, in which said shift register comprises a plurality of sets of exclusive-OR gates which are connected one after another in such a manner that the exclusive-OR gates of one set produce outputs ranging from a most significant bit to a least significant bit that are respectively applied to one bit higher inputs of the exclusive-OR gates of a following set, and that the most significant bit output of the exclusive-OR gates of said one set becomes a least significant bit input of the exclusive-OR gates of said following set.

5. An arithmetic circuit according to claim 4, in which said multiplying means comprises a plurality of AND gates to which each of said components and each bit of said second set of bits are supplied.

* * * * *